United States Patent
Huang et al.

(10) Patent No.: US 9,431,559 B2
(45) Date of Patent: Aug. 30, 2016

(54) SOLAR CELL MODULE STRUCTURE

(71) Applicant: HULK ENERGY TECHNOLOGY CO., LTD., Miaoli County (TW)

(72) Inventors: Ting-Hui Huang, Hsinchu (TW); Chien-Chung Wu, Miaoli County (TW)

(73) Assignee: HULK ENERGY TECHNOLOGY CO., LTD., Miaoli County (TW)

( * ) Notice: Subject to any disclaimer, the term of this patent is extended or adjusted under 35 U.S.C. 154(b) by 0 days.

(21) Appl. No.: 13/788,134

(22) Filed: Mar. 7, 2013

(65) Prior Publication Data
US 2014/0076399 A1    Mar. 20, 2014

(30) Foreign Application Priority Data
Sep. 14, 2012 (TW) .............................. 101133730 A

(51) Int. Cl.
*H02S 30/10* (2014.01)
*H01L 31/042* (2014.01)
*F24J 2/52* (2006.01)

(52) U.S. Cl.
CPC .......... *H01L 31/0424* (2013.01); *F24J 2/5211* (2013.01); *H02S 30/10* (2014.12); *F24J 2002/5224* (2013.01); *F24J 2002/5298* (2013.01); *Y02E 10/47* (2013.01)

(58) Field of Classification Search
CPC ........... F24L 2/5211; F24L 2002/5224; F24L 2002/5298; H02S 30/10; H01L 31/0424
USPC ................. 136/243–265; 52/173.3; 211/41.1
See application file for complete search history.

(56) References Cited

U.S. PATENT DOCUMENTS

| | | | |
|---|---|---|---|
| 4,838,951 A * | 6/1989 | Riermeier | H01L 31/048 126/623 |
| 2009/0194098 A1* | 8/2009 | Placer | 126/704 |
| 2010/0084005 A1* | 4/2010 | Myong | 136/251 |
| 2010/0212723 A1* | 8/2010 | Furukawa | 136/251 |
| 2011/0088781 A1* | 4/2011 | Yamamoto | 136/259 |
| 2013/0037087 A1* | 2/2013 | Janssens | F24J 2/4609 136/251 |
| 2013/0102165 A1* | 4/2013 | DuPont | 439/95 |
| 2013/0112247 A1* | 5/2013 | Li et al. | 136/251 |
| 2013/0228213 A1* | 9/2013 | Hashiguchi et al. | 136/251 |

FOREIGN PATENT DOCUMENTS

WO    WO 2012063612 A1 *  5/2012

OTHER PUBLICATIONS

"Traverse Definition." Dictionary.com. Dictionary.com, n.d. Web. Jun. 7, 2015. <http://dictionary.reference.com/browse/traverse>.*

* cited by examiner

*Primary Examiner* — Keith Hendricks
*Assistant Examiner* — Kourtney S Carlson
(74) *Attorney, Agent, or Firm* — WPAT, PC; Justin King; Douglas A. Hosack

(57) ABSTRACT

A solar cell module structure is disclosed, which at least comprises a frame and a solar cell. The frame is composed of four sidebars that are mounted respectively at four sides of the solar cell. Each of the two opposite ends of each sidebar is formed with a 45-degree angle cut while each sidebar is composed of a top tongue plate, a bottom tongue plate, and a junction plate in a manner that the top tongue plate is arranged parallel to or near parallel to the bottom tongue plate while allowing the junction plate to connected and disposed perpendicular to the top and bottom tongue plates in respective. In addition, the solar cell is arranged at a position enclosed between the junction plate and the top and bottom tongue plates while being disposed at a distance respectively from the three plates.

13 Claims, 21 Drawing Sheets

SOLAR CELL MODULE STRUCTURE

CROSS REFERENCE TO RELATED APPLICATION

The present application is based on, and claims priority from, Taiwan (International) Application Serial Number 101133730, filed on Sep. 14, 2012, the disclosure of which is hereby incorporated by reference herein in its entirety.

FIELD OF THE INVENTION

The present invention relates to solar cell, and more particularly, to a solar cell module structure that is simple in structure, small in size, thin in thickness and easy in assembly.

BACKGROUND OF THE INVENTION

For a conventional solar cell module based on copper indium gallium selenide (CIGS), it is basically formed as a solar cell that is made by depositing a metallic back layer, a p-type absorber layer, a high-resistance buffer layer and a n-type window layer on a substrate. Moreover, after being sandwiched inside a weather-resistance film made of a filling material, such as ethylene vinyl acetate (EVA), the so-constructed solar cell is further being covered by a compactly fitted inside a glass housing while being framed by a frame structure that can be made of aluminum. Thereby, the solar cell module that is being framed inside the frame structure is capable of preventing the incursion of water and moisture into the glass housing and thus improving the weather resistance of the solar cell module.

It is noted that there will be filling materials being filled into the aluminum frame structure before integrating the aluminum frame structure with the solar cell element, and thus, while fitting the solar cell element into the aluminum frame structure, the filling materials will be squeezed and thus overflowed out of the frame structure and onto the front and back of the solar cell element.

Please refer to FIG. 1 to FIG. 3, which are respectively a schematic diagram showing a conventional solar cell module, a partial exploded view of a conventional solar cell module; and a three-dimensional diagram showing a portion of a sidebar used in a conventional solar cell module.

In a conventional solar cell module 10, its aluminum frame 11' is generally composed of four sidebars that are joined and assembled using corner joints 14'. Substantially, each sidebar 13' must be configured with two sleeve joint parts 131' that are extendedly formed at the two opposite ends thereof in respective and provided for a corresponding corner joints 13' to inset therein. Thereby, by the connection of the four corner joints, the four sidebars 13' can be assembled into the aluminum frame 11' for framing a solar cell 12'. In addition to the four sidebars 13', the use of the four corner joints 14' which is necessary for achieving the aluminum frame 11' is going to cause the overall material cost to increase. Moreover, since each sidebar 13' is configured with two sleeve joint parts 131' that are extendedly formed at the two opposite ends thereof, the use of such sidebars 13' will cause the so-achieved aluminum frame 11' to be larger in size and thicker in thickness. Consequently, the disposition of the conventional solar cell module with such aluminum frame 11' can be restricted by space limitations.

Therefore, it is in need of a solar cell module for overcoming the aforesaid shortcomings.

SUMMARY OF THE INVENTION

The primary object of the present invention is to provide a solar cell module structure, within which there is an anti-separation mechanism being formed between any two neighboring sidebars that are connected with each other. Thereby, the solar cell module structure of the present invention is advantageous in that: the friction between two neighboring sidebars is enhanced so as to improve the overall structural rigidity of the solar cell module structure, the manufacture cost is lowered, the overall structure is simpler and more compact, the size can be made smaller as well as the thickness is thinner, and the assembly is quick and easy.

To achieve the above object, the present invention provides a solar cell module structure, at least comprising: a frame; and a solar cell; wherein, the frame is composed of four sidebars that are mounted respectively at four sides of the solar cell, and each of the two opposite ends of each sidebar is formed with an angle cut while each sidebar is composed of a top tongue plate, a bottom tongue plate, and a junction plate in a manner that the top tongue plate is arranged parallel to or near parallel to the bottom tongue plate while allowing the junction plate to connected and disposed perpendicular to the top and bottom tongue plates in respective; and the solar cell is arranged at a position enclosed between the junction plate and the top and bottom tongue plates while being disposed at a distance respectively from the three plates. In an embodiment, there is an anti-separation mechanism being formed at a joint of two corresponding angle cuts of two of the four sidebar that are to be connected.

In an embodiment, the anti-separation mechanism is substantially a contoured interlock structure being formed in a shape selected from the group consisting of: an arc, a rectangle, a trapezoid, a triangle and a combination of at least two aforesaid shapes.

In another embodiment, the anti-separation mechanism is composed of two via holes and a fastener, and the fastener is configured with two fixing parts to be used for insetting into the corresponding via holes for interlocking.

In another embodiment, each of the two via holes is formed in a shape selected from the group consisting of: a circle, a square, a rectangle, a polygon, and a geometrical shape combining at least two aforesaid shapes, and also the two holes are formed respectively on two ends of two corresponding bottom tongue plate. In addition, the fastener is composed of two hooks, being used for inserting and piercing through the two corresponding via holes formed respectively on the two bottom tongue plates of two of the four sidebars that are connected to each other for fixedly interlocking the two connected sidebars.

In another embodiment, the two via holes are elongated and are formed respectively at two ends of two bottom tongue plates of two of the four sidebars that are connected to each other; and the fastener is composed of two locking pieces, being used for inserting and piercing through the two corresponding via holes formed respectively on the two bottom tongue plates of two of the four sidebars that are connected to each other for fixedly interlocking the two connected sidebars.

In another embodiment, each of the angle cuts is a 45-degree angle cut.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
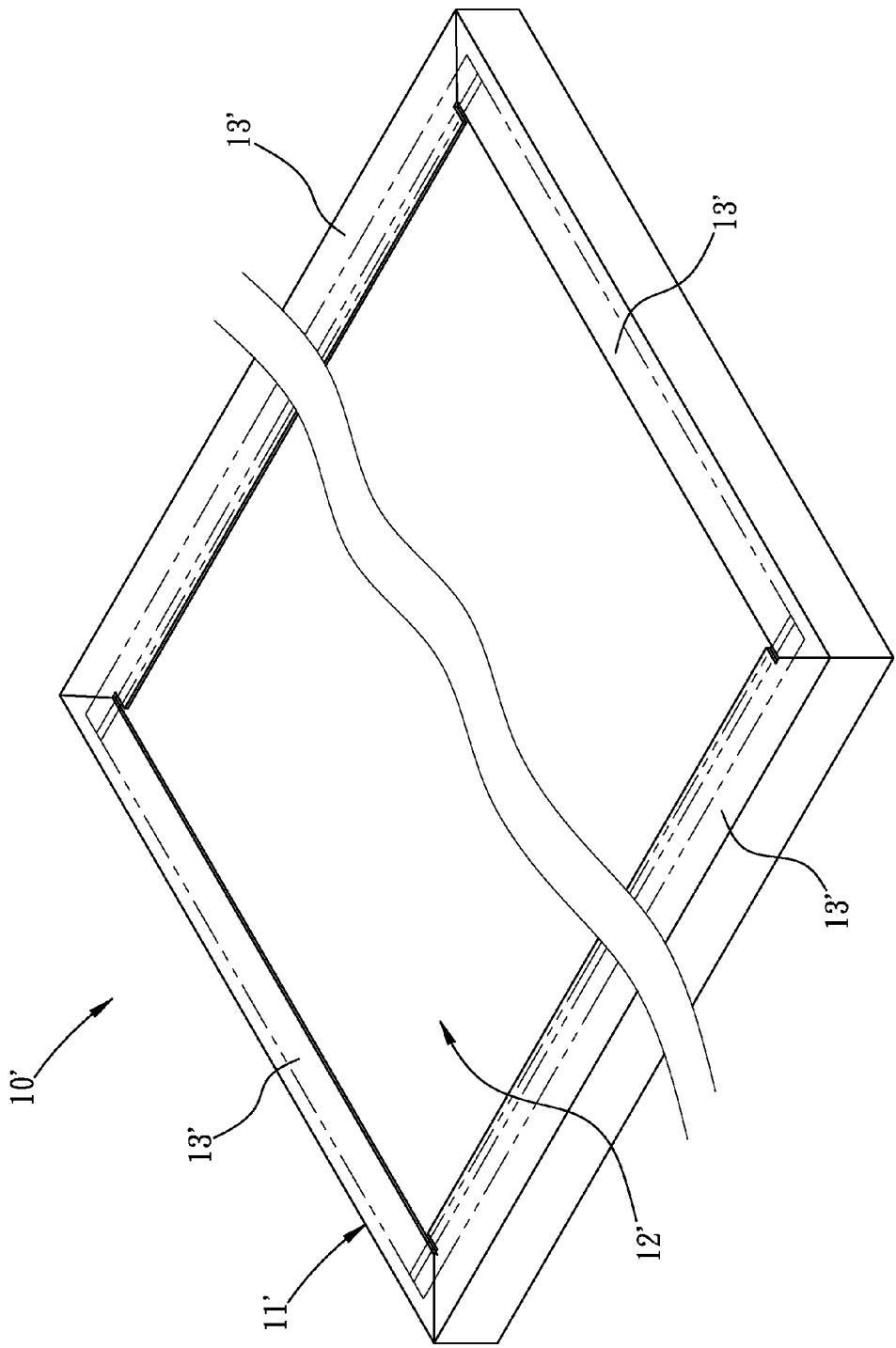
FIG. 1 is a schematic diagram showing a conventional solar cell module.
Figure 2:
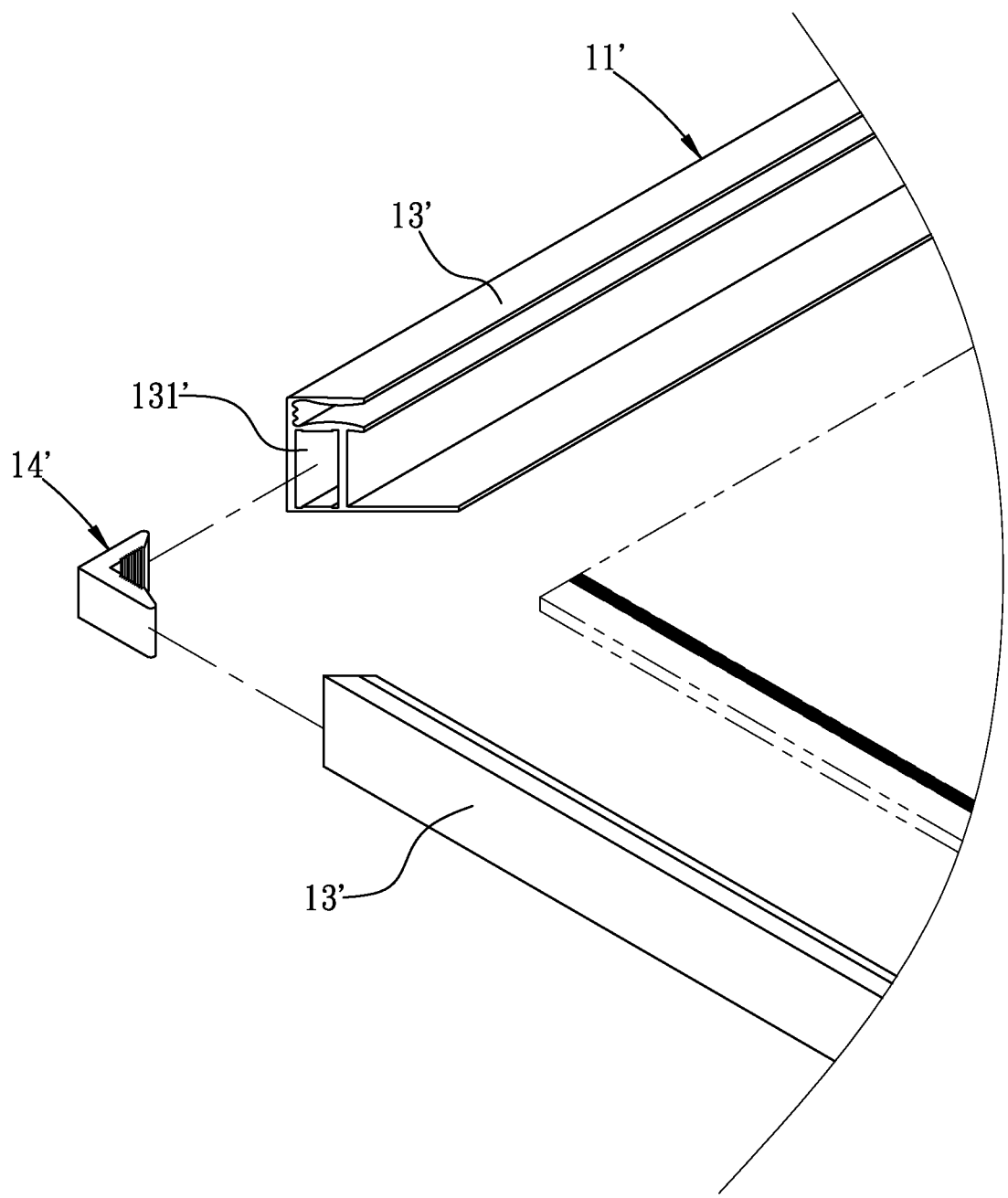
FIG. 2 is a partial exploded view of a conventional solar cell module.
Figure 3:
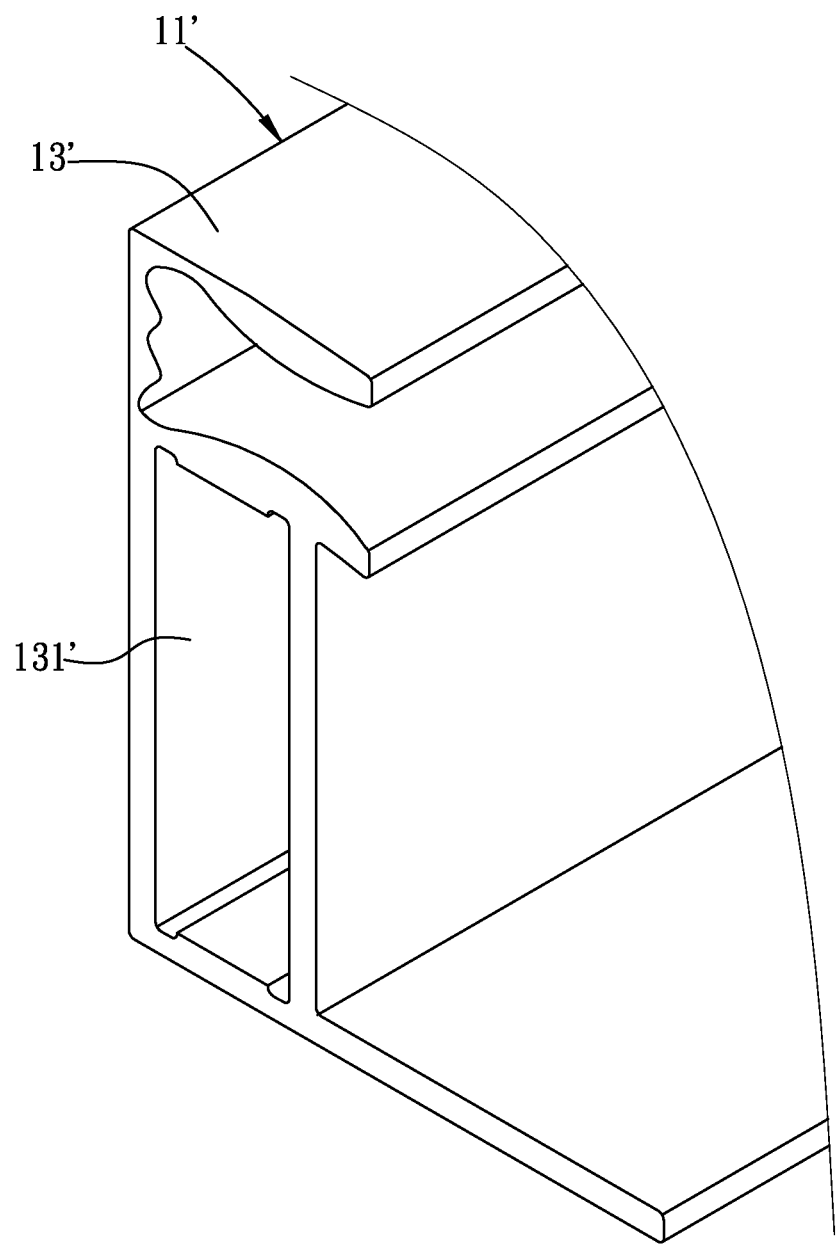
FIG. 3 is a three-dimensional diagram showing a portion of a sidebar used in a conventional solar cell module.
Figure 4:
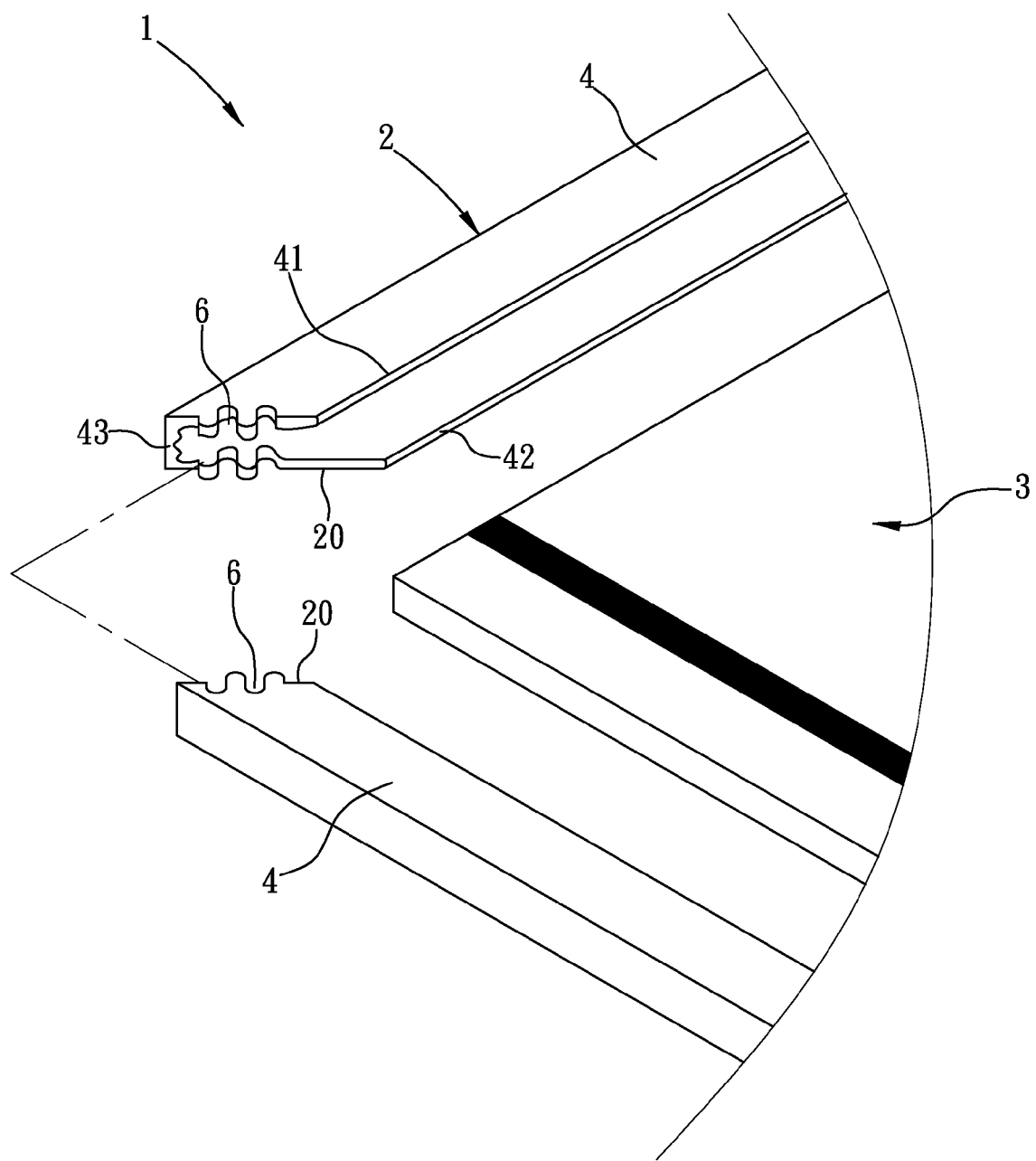
FIG. 4 is a partial exploded view of a solar cell module structure according to an embodiment of the invention.
Figure 5:
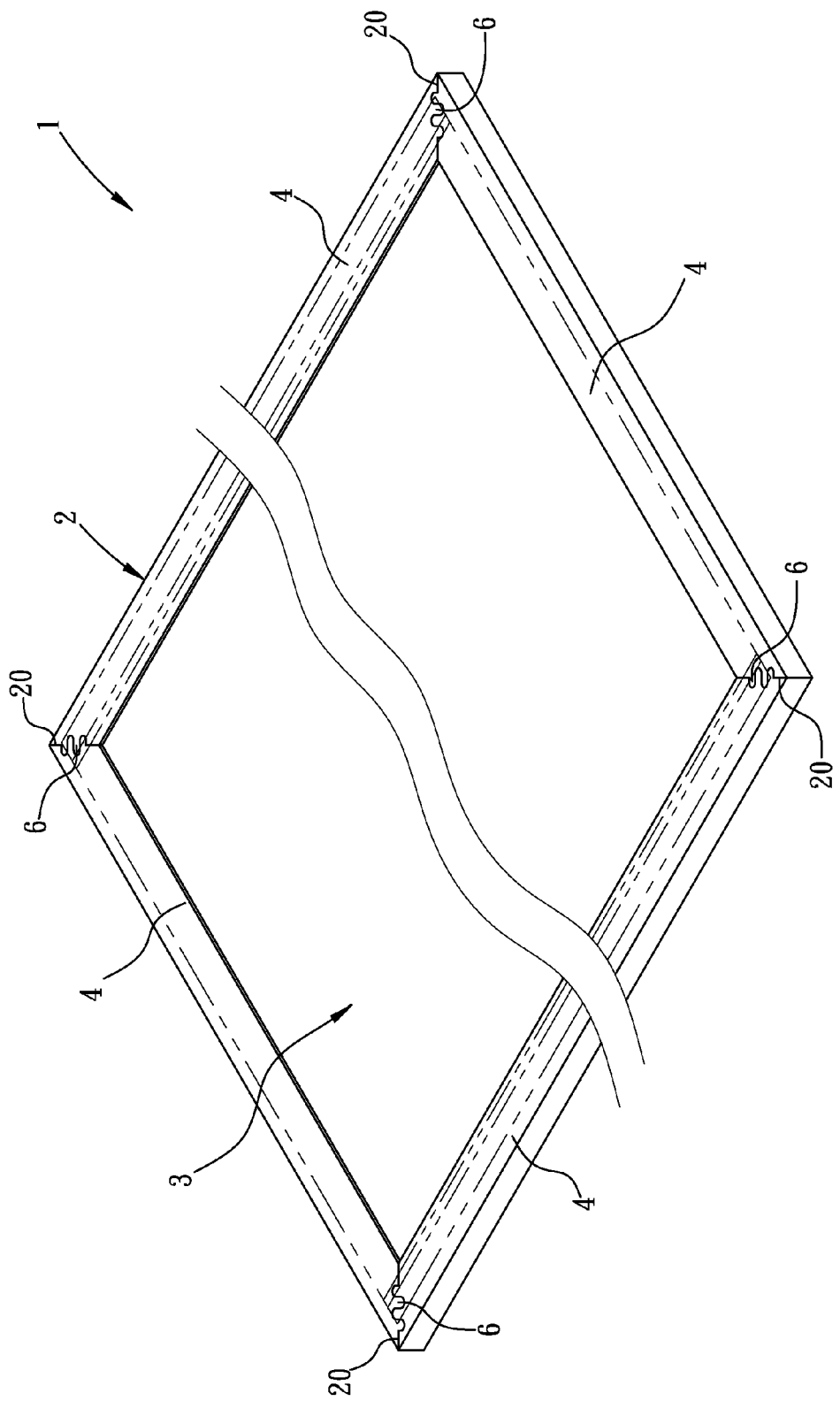
FIG. 5 is a three-dimensional diagram showing a solar cell module structure according to an embodiment of the invention.

Please refer to FIG. 4 and FIG. 5, which are respectively a partial exploded view of a solar cell module structure according to an embodiment of the invention, and a three-dimensional diagram showing a solar cell module structure according to an embodiment of the invention. As shown in FIG. 4 and FIG. 5, a solar cell module structure 1 of the invention at least comprises: a frame 2 and a solar cell 3, in which the frame 2 is composed of four sidebars 4 that are mounted respectively at four sides of the solar cell 3, and each of the two opposite ends of each sidebar 4 is formed with an angle cut, that is preferably to be a 45-degree angle cut, but is not limited thereby. In an embodiment when each of the two ends of each sidebars 4 are formed with a 45-degree angle cut, a 90-degree corner can be achieved by the coupling of two 45-degree angle cuts of two corresponding ends on two sidebars 4 that are to be connected so as to form the frame 2.

Figure 9:
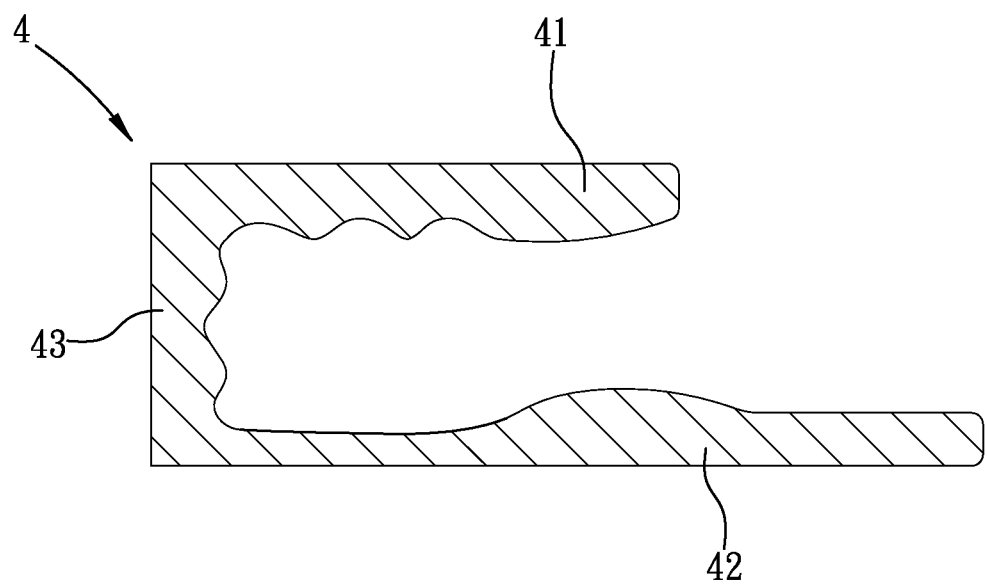
FIG. 9 is a cross sectional view of a sidebar used in a solar cell module structure of the invention.
Figure 10:
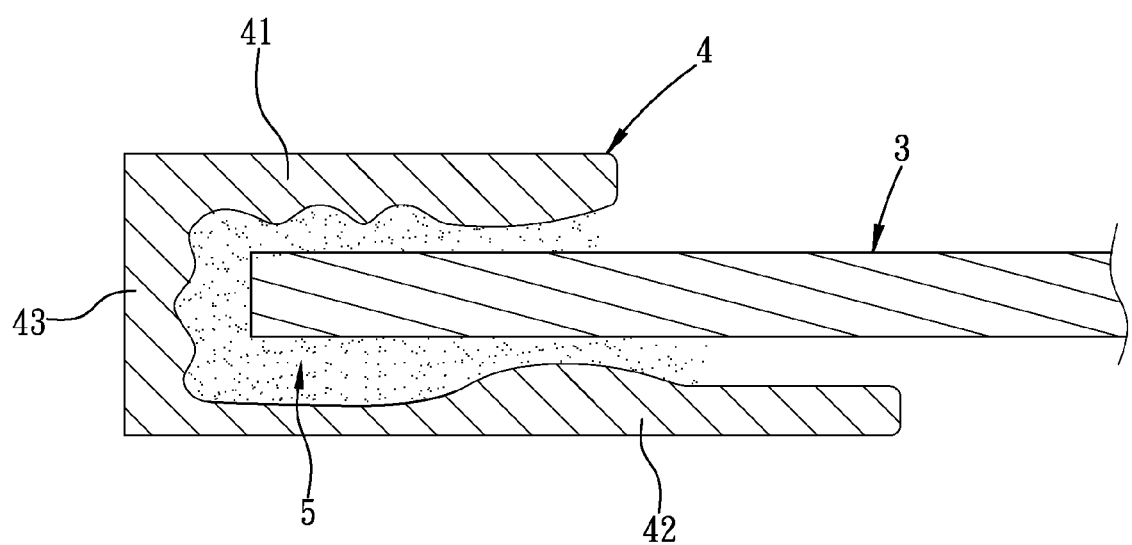
FIG. 10 is a cross sectional diagram showing a solar cell module structure having a filler filled in the space sandwiched between sidebars and solar cell.
Figure 11:
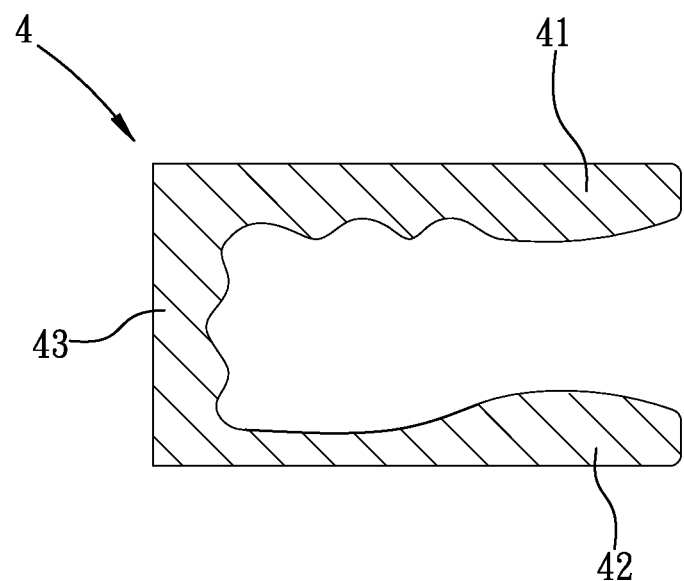
FIG. 11 is a cross sectional view of a sidebar according to an embodiment of the invention that is corresponding to the one shown in FIG. 9.
Figure 12:
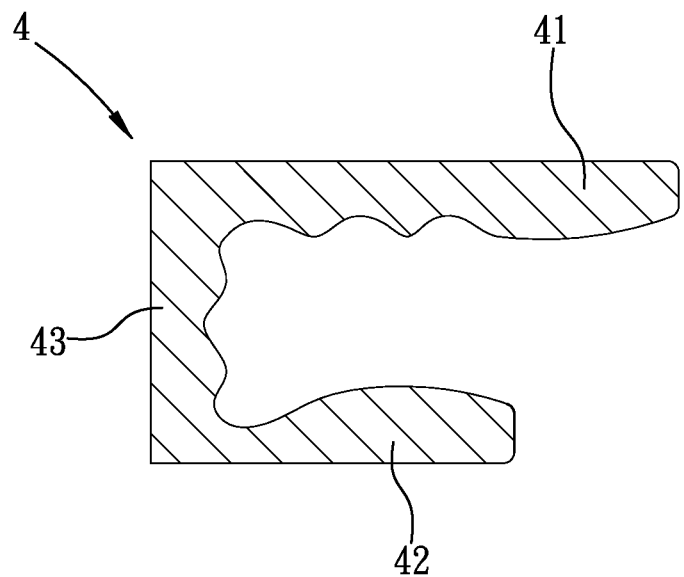
FIG. 12 is a cross sectional view of a sidebar according to an embodiment of the invention that is corresponding to the one shown in FIG. 10.

Moreover, each sidebar 4 is composed of a top tongue plate 41, a bottom tongue plate 42, and a junction plate 43 in a manner that the top tongue plate 41 is arranged parallel to or near parallel to the bottom tongue plate 42 while allowing the junction plate 43 to connected and disposed perpendicular to the top and bottom tongue plates 41 and 42 in respective. In detail, the junction plate 43 is perpendicularly connected respectively the top tongue plate 41 and the bottom tongue plate 42 by the two opposite ends thereof, as shown in FIG. 9 and FIG. 10. Preferably, the top tongue plate 41 is formed in a length shorter than that of the bottom tongue plate 42 so as to prevent any filler from overflowing, as shown in FIG. 9, but it is not limited thereby. Obviously, the top tongue plate 41 can be formed in a length equal to than that of the bottom tongue plate 42, as shown in FIG. 11; or the top tongue plate 41 is formed in a length shorter than that of the bottom tongue plate 42, as shown in FIG. 12.

In addition, the solar cell 3 is arranged at a position enclosed between the junction plate 43 and the top and bottom tongue plates 41, 42 while being disposed at a distance respectively from the three plates 41, 42, and 43, as shown in FIG. 10. Consequently, there can be a filler filled in the space formed by the enclosure of the four sides of the solar cell 3, the top tongue plates 41, the bottom tongue plates 42 and the junction plates 43 of the four sidebars 4.

Figure 6:
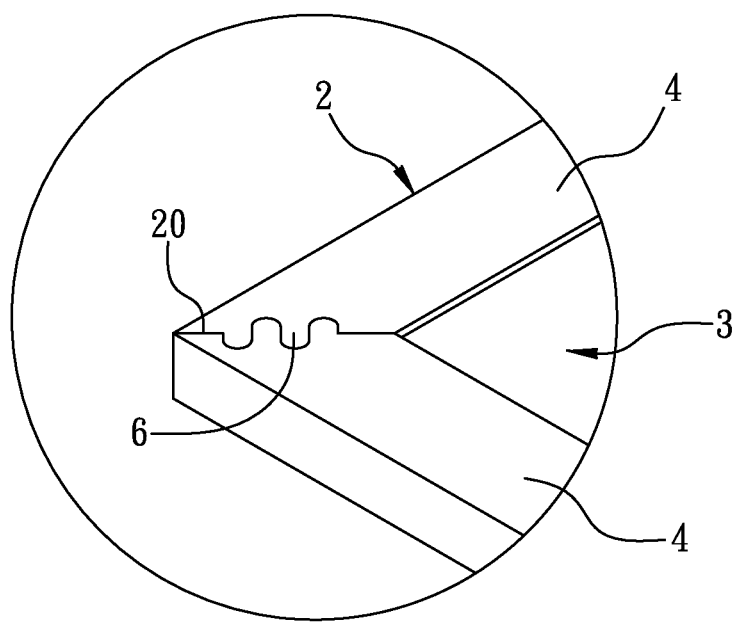
FIG. 6 is an enlarged partial view of a contoured interlock structure used in a solar cell module structure according to a first embodiment of the invention.
Figure 7:
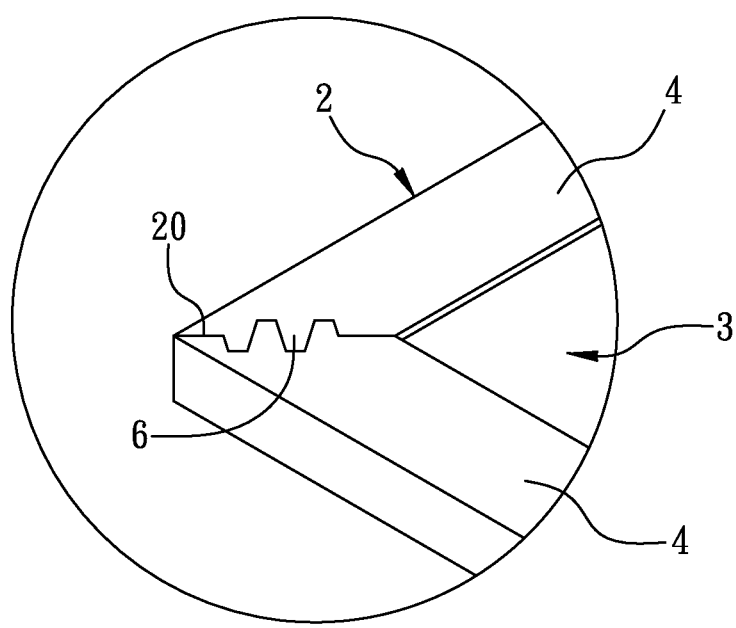
FIG. 7 is an enlarged partial view of a contoured interlock structure used in a solar cell module structure according to a second embodiment of the invention.
Figure 8:
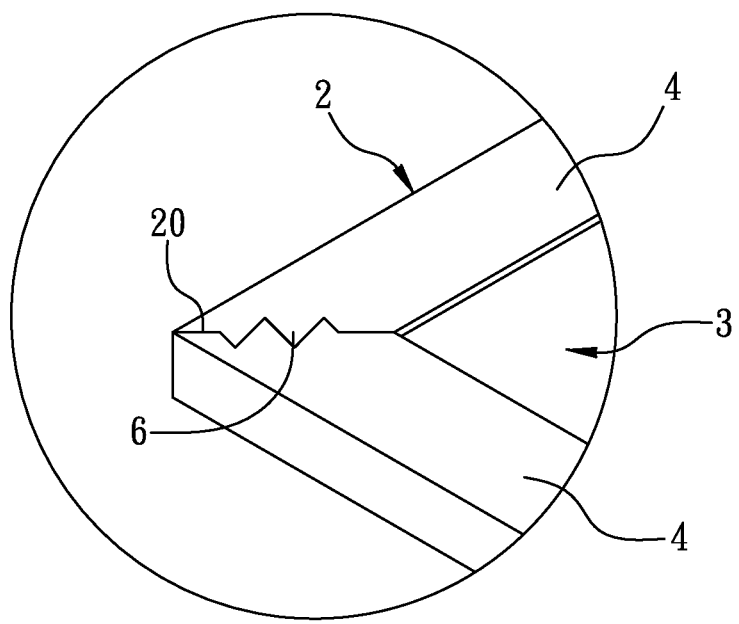
FIG. 8 is an enlarged partial view of a contoured interlock structure used in a solar cell module structure according to a third embodiment of the invention.

Please refer to FIG. 6, FIG. 7 and FIG. 8, which are respectively an enlarged partial view of a contoured interlock structure used in a solar cell module structure according to a first embodiment of the invention; an enlarged partial view of a contoured interlock structure used in a solar cell module structure according to a second embodiment of the invention; and an enlarged partial view of a contoured interlock structure used in a solar cell module structure according to a third embodiment of the invention. As shown in FIG. 6 to FIG. 8, there is an anti-separation mechanism being formed at a joint of two corresponding 45-degree angle cuts of two of the four sidebars 4 that are to be connected; and the anti-separation mechanism can substantially be a contoured interlock structure 6, that is formed in a shape selected from the group consisting of: an arc, a rectangle, a trapezoid, a triangle and a combination of at least two aforesaid shapes. Thereby, the friction between two connecting sidebars 4 can be enhanced, and therefore, with the help of the sticky filler, the four sidebars 4 can be fixedly connected to one another into the frame 2.

Figure 13:
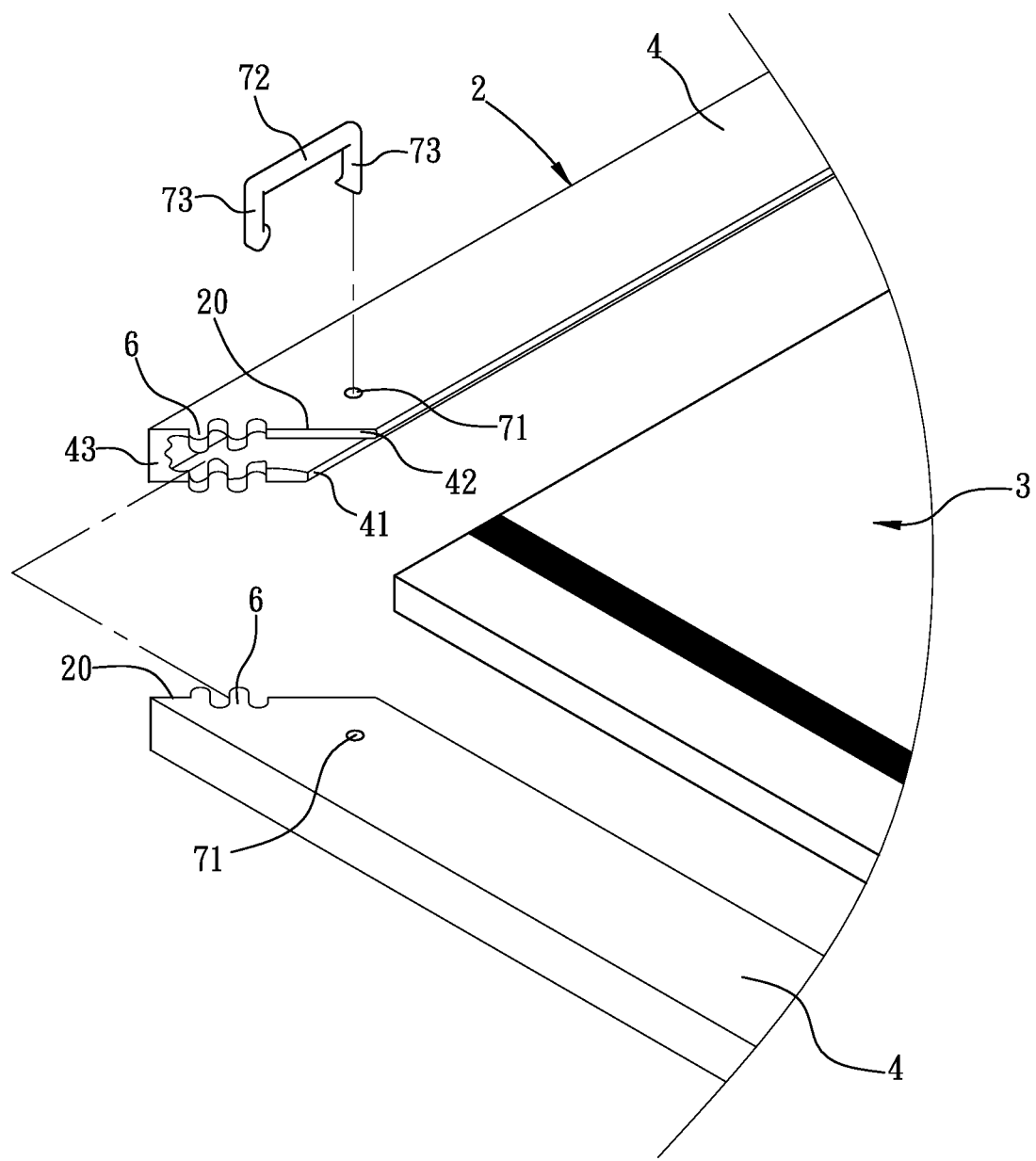
FIG. 13 is an enlarged partial exploded vie of an anti-separation mechanism used in a solar cell module structure according to an embodiment of the invention.
Figure 14:
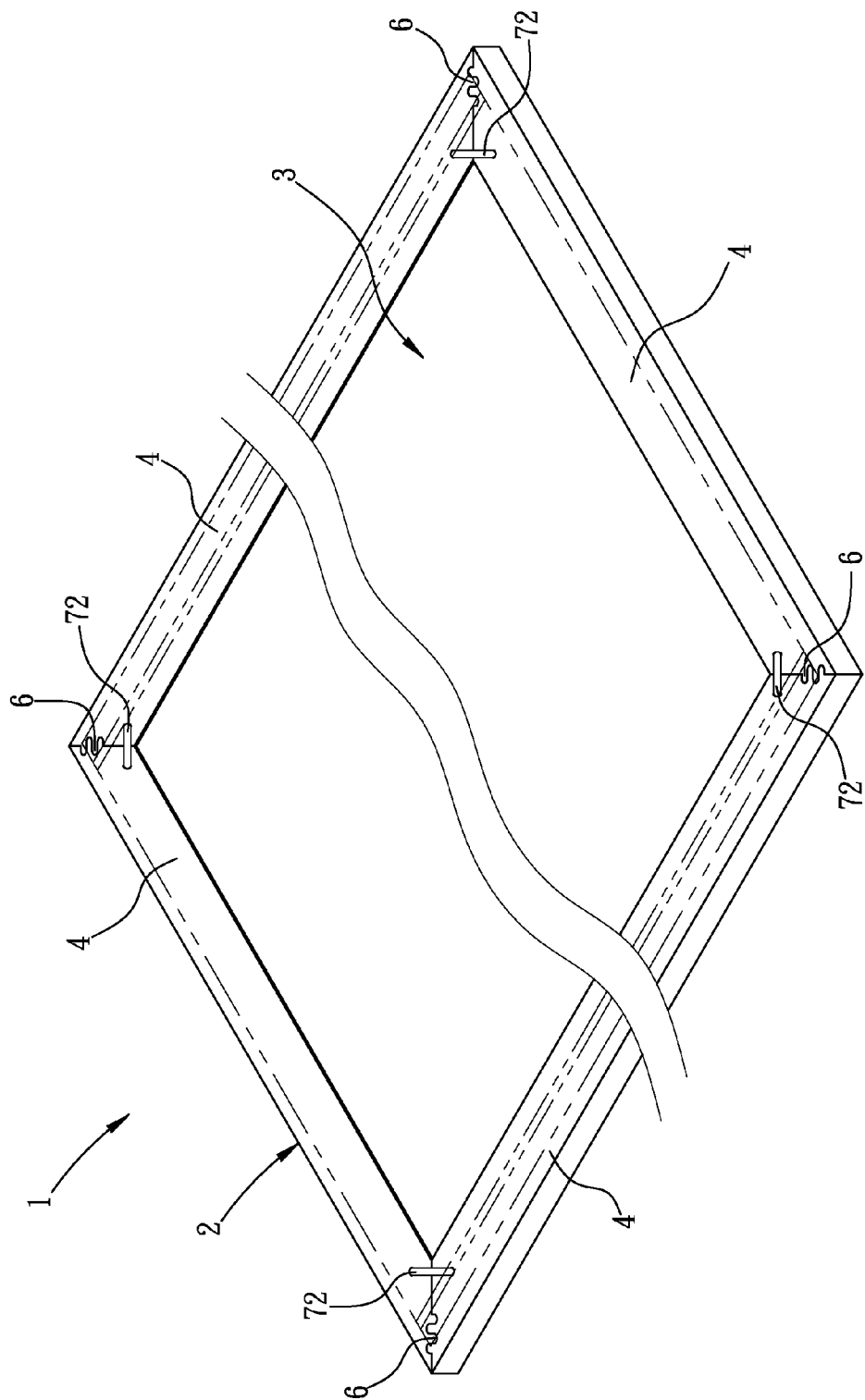
FIG. 14 is a three-dimensional diagram showing a solar cell module structure with anti-separation mechanism of FIG. 13.
Figure 15:
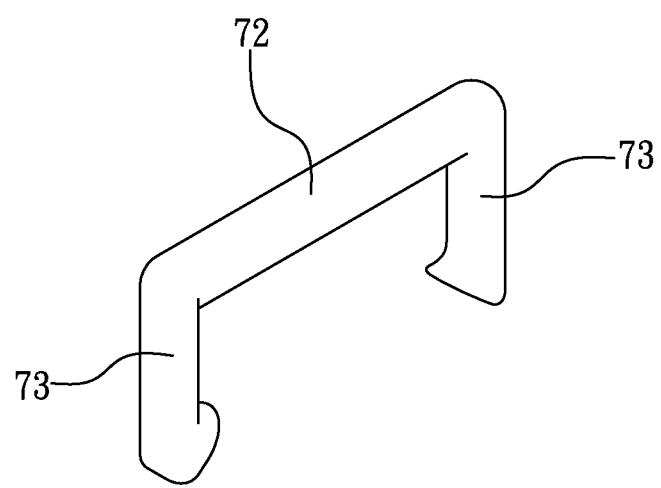
FIG. 15 is three-dimensional diagram showing a fastener used in a solar cell module structure according to an embodiment of the invention.
Figure 16:
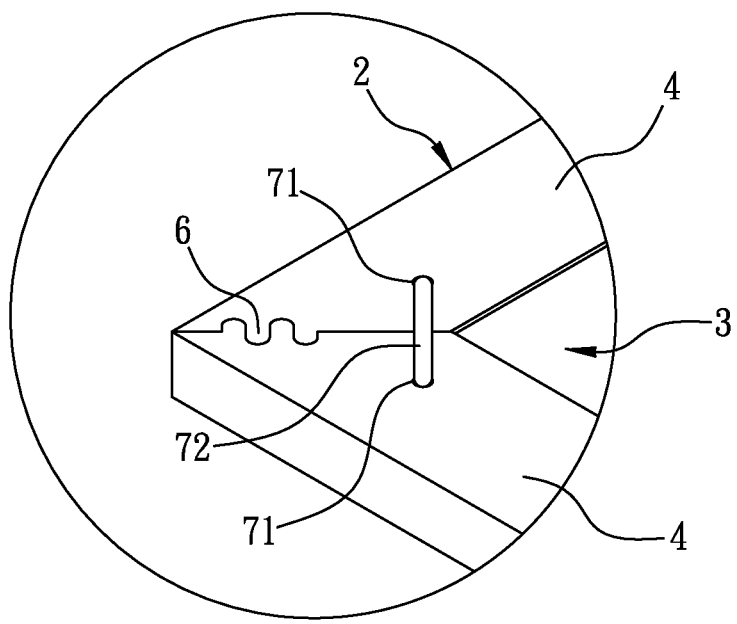
FIG. 16 is an enlarged partial view of an anti-separation mechanism used in a solar cell module structure according to an embodiment of the invention.
Figure 17:
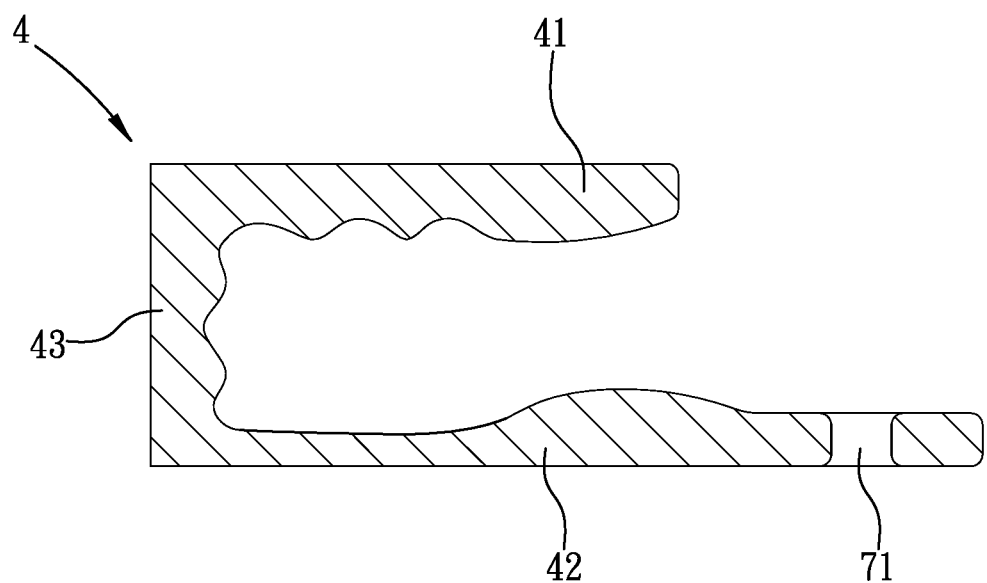
FIG. 17 is a cross sectional diagram showing a sidebar having a via hole formed on its bottom tongue plate at one end thereof according to the present invention.
Figure 18:
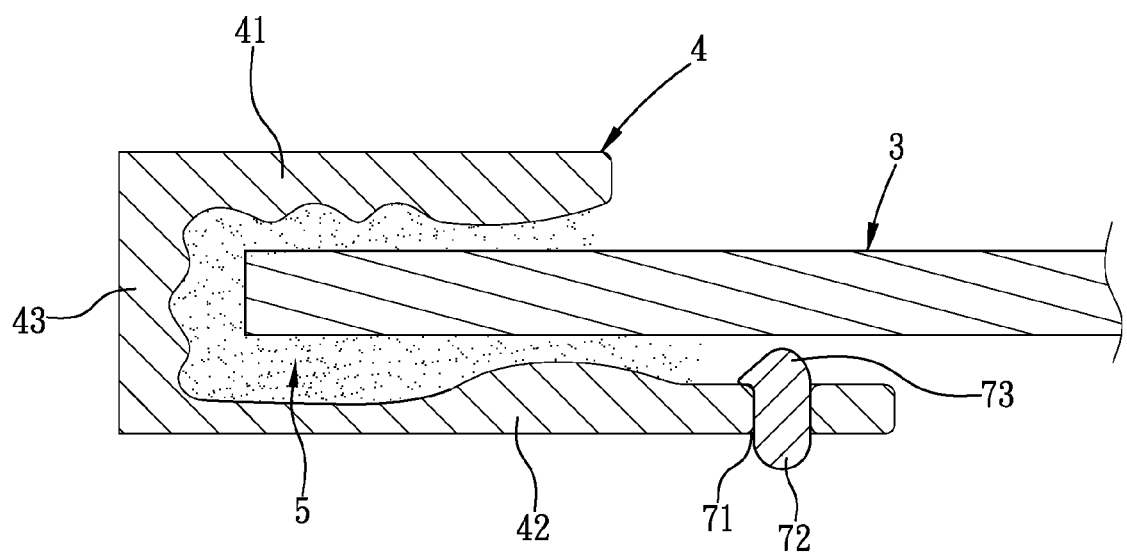
FIG. 18 is a cross sectional diagram showing how a fixing part is being inserted and piercing through its corresponding via hole on a sidebar according to an embodiment of the invention.

Please refer to FIG. 13 to FIG. 18, in which FIG. 13 is an enlarged partial exploded vie of an anti-separation mechanism used in a solar cell module structure according to an embodiment of the invention; FIG. 14 is a three-dimensional diagram showing a solar cell module structure with anti-separation mechanism of FIG. 13; FIG. 15 is three-dimensional diagram showing a fastener used in a solar cell module structure according to an embodiment of the invention; FIG. 16 is an enlarged partial view of an anti-separation mechanism used in a solar cell module structure according to an embodiment of the invention; FIG. 17 is a cross sectional diagram showing a sidebar having a via hole formed on its bottom tongue plate at one end thereof according to the present invention; and FIG. 18 is a cross sectional diagram showing how a fixing part is being inserted and piercing through its corresponding via hole on a sidebar according to an embodiment of the invention.

In addition to the aforesaid contoured interlock structure 6, the anti-separation mechanism can further includes at least two via holes 71 and at least one fastener 72. In the embodiments shown in FIG. 13 to FIG. 18, two via holes and one fastener are used as exemplary, but are not limited thereby. Moreover, each of the two via holes 71 is formed in a shape selected from the group consisting of: a circle, a square, a rectangle, a polygon, and a geometrical shape combining at least two aforesaid shapes, but is not limited thereby; and also the two holes 71 are formed respectively on two ends of two corresponding bottom tongue plate 42. The fastener 72 is composed of fixing parts, and in this embodiment, the two fixing parts are substantially two hooks 73, that are respectively used for inserting and piercing through the two corresponding via holes 71 formed respectively on the two bottom tongue plates 42 of two of the four sidebars 4 that are connected to each other for fixedly interlocking the two connected sidebars 4, as shown in FIG. 18.

In another embodiment, there can be no such contoured interlock structure 6 being formed at the joint of two corresponding 45-degree angle cuts 20, and thus the anti-separation mechanism only includes the two via holes 71 and the fastener 72. Nevertheless, without the contoured interlock structure 6, the connecting sidebars 4 still can be fixedly connected to each other into the frame 2 and is advantageous in that: the material and time required for formed such contoured interlock structure 6 can be saved.

Figure 19:
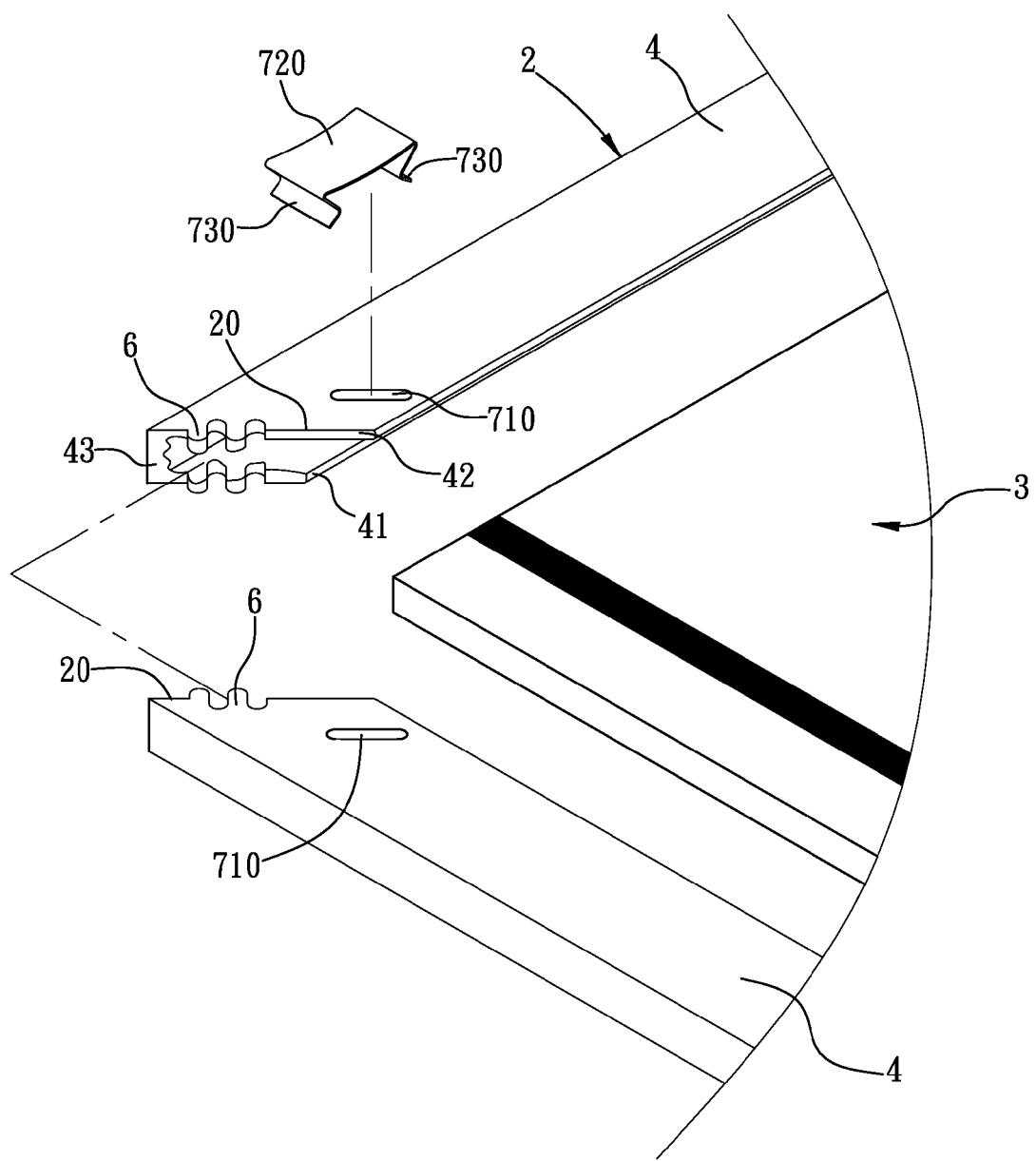
FIG. 19 is an enlarged partial exploded vie of an anti-separation mechanism used in a solar cell module structure according to another embodiment of the invention.
Figure 20:
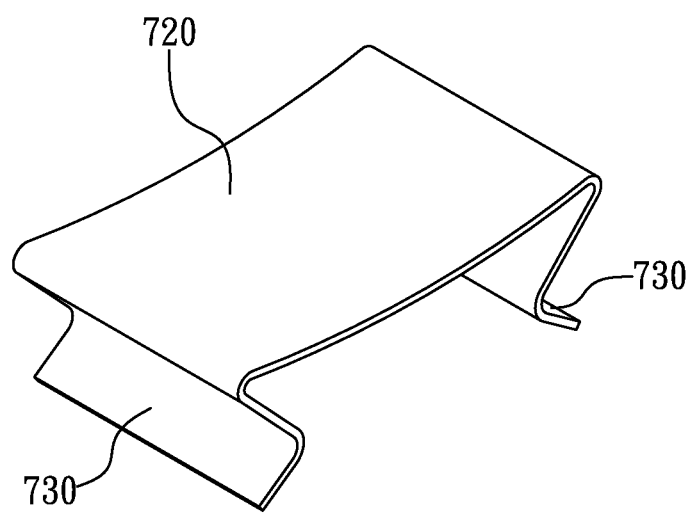
FIG. 20 is a three-dimensional view showing an exemplary fastener used in the embodiment of FIG. 19.
Figure 21:
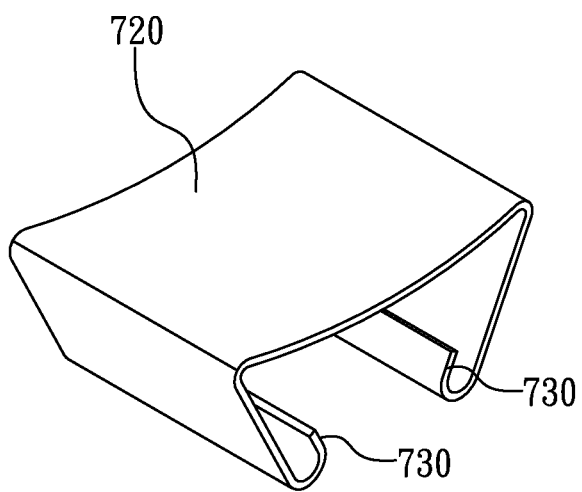
FIG. 21 is a three-dimensional view showing another exemplary fastener used in the embodiment of FIG. 19.

Please refer to FIG. 19 and FIG. 21, in which FIG. 19 is an enlarged partial exploded vie of an anti-separation mechanism used in a solar cell module structure according to another embodiment of the invention; FIG. 20 is a three-dimensional view showing an exemplary fastener used in the embodiment of FIG. 19; and FIG. 21 is a three-dimensional view showing another exemplary fastener used in the embodiment of FIG. 19. As shown in FIG. 19 to FIG. 21, in addition to the contoured interlock structure 6, the anti-separation mechanism can further comprise two via holes 710 and one fastener 720. Moreover, the two via holes 710 are elongated and are formed respectively at two ends of two bottom tongue plates 42 of two of the four sidebars 4 that are connected to each other; and the fastener 720, being an elastic sheet structure, is composed of two locking pieces 730, being used for inserting and piercing through the two corresponding elongated via holes 710 formed respectively on the two bottom tongue plates 42 of two of the four sidebars 4 that are connected to each other for fixedly interlocking the two connected sidebars 4. In FIG. 20, the tail of each locking piece 720 is curved outwardly, and in FIG. 21, the tail of each locking piece 720 is curved inwardly, but it is not limited thereby.

Similarly, in those embodiment shown in FIG. 19 to FIG. 21, there can be no such contoured interlock structure 6 being formed at the joint of two corresponding 45-degree angle cuts 20, and thus the anti-separation mechanism only includes the two via holes 710 and the fastener 720. Nevertheless, without the contoured interlock structure 6, the connecting sidebars 4 still can be fixedly connected to each other into the frame 2 and is advantageous in that: the material and time required for formed such contoured interlock structure 6 can be saved.

From the above description, it is noted that each sidebar 4 used in the present invention is only composed of a top tongue plate 41, a bottom tongue plate 42 and a junction plate 43, which is simpler in structure comparing with those conventional sidebars that are formed with extending sleeve joint parts for housing corresponding corner joints, and thus not only the overall cost is reduced, but also it can be built in smaller size and thinner thickness.

Moreover, with the anti-separation mechanism, such as the contoured interlock structure 6 with additional two via holes 71 and a fastener 71, not only the connection between two connected sidebars 4 can further be secured, but also it is comparatively easier to assemble or dismantle the solar cell module structure of the invention.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:
1. A solar cell module structure, comprising:
    a solar cell; and
    a frame, comprising:
        four sidebars, mounted respectively at four sides of the solar cell, each sidebar comprising:
            two opposite ends, each formed with an anglecut;
            a top tongue plate;
            a bottom tongue plate, parallel to or near parallel to the top tongue plate;
            a via hole, extending through said bottom tongue plate; and
            a junction plate, connecting and disposed perpendicular to the top tongue plate and the bottom tongue plate; and
        an anti-separation mechanism, formed at a joint of two corresponding angle cuts of two of the four sidebars that are to be connected, the anti-separation mechanism comprising:
            a fastener, comprising:
                two fixing parts set correspondingly into the two via holes extending through the bottom tongue plates of said two of the four sidebars for interlocking said two of the four sidebars; and a connecting piece, joining said two fixing parts, wherein the solar cell is disposed between the junction plate, the top tongue plate and the bottom tongue plate, and said connecting piece is entirely disposed on an opposite side of said bottom tongue plate from said solar cell.

2. The solar cell module structure of claim 1, wherein the anti-separation mechanism comprises a contoured interlock structure.

3. The solar cell module structure of claim 2, wherein the contoured interlock structure is formed in a shape selected from the group consisting of: an arc, a rectangle, a trapezoid, a triangle and a combination of at least two aforesaid shapes.

4. The solar cell module structure of claim 2, wherein said contoured interlock structure comprises:

a protruding shape; and a recess, complementary to said protruding shape.

5. The solar cell module structure of claim 4, wherein said protruding shape is a semi-circle.

6. The solar cell module structure of claim 4, wherein said protruding shape is a trapezoid.

7. The solar cell module structure of claim 4, wherein said protruding shape is a triangle.

8. The solar cell module structure of claim 1, wherein each of the two via holes is a shape selected from a group consisting of: a circle, a square, a rectangle, a polygon, and a geometrical shape combining at least two aforesaid shapes; and the fastener is composed of two hooks, being used for inserting and piercing through the two corresponding via holes formed respectively on the two bottom tongue plates of two of the four sidebars that are connected to each other, via the connecting piece, for fixedly interlocking the two connected sidebars.

9. The solar cell module structure of claim 1, wherein the two via holes are elongated; and the fastener is composed of two locking pieces, being used for inserting and piercing through the two corresponding elongated via holes formed respectively on the two bottom tongue plates of two of the four sidebars that are connected to each other, via the connecting piece, for fixedly interlocking the two connected sidebars.

10. The solar cell module structure of claim 1, wherein there is a filler filled in the space formed by the enclosure of the four sides of the solar cell, the top tongue plates, the bottom tongue plates and the junction plates of the four sidebars.

11. The solar cell module structure of claim 1, wherein the top tongue plate is shorter than, equal to, or longer than the bottom tongue plate.

12. The solar cell module structure of claim 1, wherein each of the angle cuts is a 45-degree angle cut.

13. The solar cell module structure of claim 1, wherein the top tongue plate is longer than the bottom tongue plate.

* * * * *